United States Patent
Theus et al.

(10) Patent No.: US 7,521,994 B2
(45) Date of Patent: Apr. 21, 2009

(54) THREE-STAGE AMPLIFIER

(75) Inventors: Ulrich Theus, Gundelfingen (DE); Juergen Kessel, Freiburg (DE)

(73) Assignee: MICRONAS GmbH, Freigburg (DE)

( * ) Notice: Subject to any disclaimer, the term of this patent is extended or adjusted under 35 U.S.C. 154(b) by 0 days.

(21) Appl. No.: 11/903,191

(22) Filed: Sep. 20, 2007

(65) Prior Publication Data

US 2008/0122536 A1    May 29, 2008

(30) Foreign Application Priority Data

Sep. 20, 2006   (DE) ................... 10 2006 044 732

(51) Int. Cl.
    $H03F$ $3/45$   (2006.01)
(52) U.S. Cl. ............................. 330/69; 330/9
(58) Field of Classification Search ............ 330/9, 330/69, 253, 257, 261
    See application file for complete search history.

(56) References Cited

U.S. PATENT DOCUMENTS

| | | | |
|---|---|---|---|
| 3,629,719 A * | 12/1971 | Heller et al. | 330/69 |
| 4,484,146 A * | 11/1984 | Naito | 330/69 |
| 5,095,282 A * | 3/1992 | Dayton | 330/69 |
| 5,608,352 A | 3/1997 | Itakura | |
| RE36,013 E | 12/1998 | Lee | |
| 6,396,343 B2 * | 5/2002 | Chee | 330/69 |
| 6,697,611 B1 | 2/2004 | Franca-Neto | |
| 7,265,615 B2 * | 9/2007 | Alexander et al. | 330/69 |
| 2006/0097791 A1 | 5/2006 | Shuler, Jr. et al. | |

FOREIGN PATENT DOCUMENTS

| | | |
|---|---|---|
| EP | 0460 263 A1 | 12/1991 |
| EP | 0460 263 B1 | 12/1991 |

* cited by examiner

*Primary Examiner*—Henry K Choe
(74) *Attorney, Agent, or Firm*—Maginot, Moore & Beck

(57) ABSTRACT

A CMOS output stage operates in A/B push-pull mode and is driven with a control potential (ud) from a preamplifier stage via a control line (st). The control line (st) feeds the gate terminals of a complementary transistor pair (kt), the first transistor (n1) of which is used as first push-pull output transistor and the second transistor (p1) of which is connected to the gate terminal of a second push-pull output transistor (pa) via a current balancing arrangement. The source terminal of the first and of the second transistor (n1, p1) is connected to a first and, respectively, to a second fixed potential (u1, u2), the second fixed potential (u2) being stabilised in a low-impedance manner by an active compensation circuit (K).

8 Claims, 2 Drawing Sheets

THREE-STAGE AMPLIFIER

Figure 1:
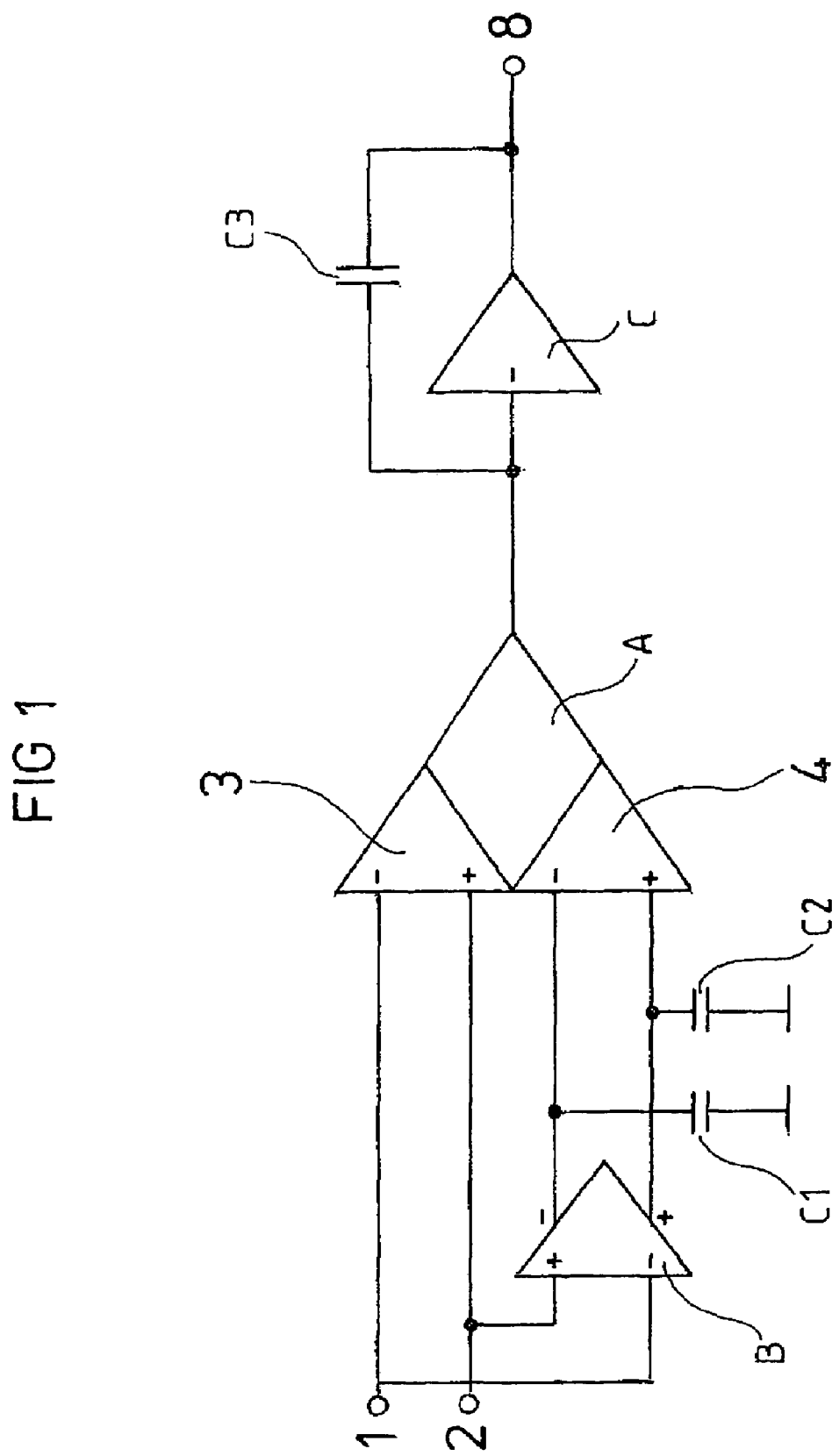

The invention relates to a three-stage amplifier circuit equipped with offset reduction and a sufficiently high bandwidth for application in the audio frequency range.

Usable bandwidth, direct voltage amplification, offset and noise represent not only the essential parameters, but frequently also parameters which limit performance of operational amplifiers. At the same time, although amplifiers realized with CMOS technology for example are characterized by low quiescent currents, they also have a relatively high offset voltages and relatively high noise. Nevertheless, CMOS technology is preferred for the miniaturized design of integrated circuits because in comparison to other technologies, a small power dissipation and therefore also a limited heat development can be obtained, even with a high component density in integrated circuits.

Typically, integrated amplifier circuits designed with CMOS technology according to the prior art are realized for example as two-stage amplifier circuits. A similar amplifier circuit which has a sufficiently high bandwidth is known for example from EP 0460 463 B1.

Symmetrical amplifier circuits are known from prior art. In principle, two power sources with a common mode regulator are used as load. Such known amplifier circuits exhibit a low impedance for common mode control and exhibit high impedance for push-pull control. Therefore, such known circuits require common mode control.

However, the increasing miniaturization of integrated amplifier circuits in CMOS technology, combined with complex integrated solutions in the arrangement of individual circuits, lead to a further reduction of the spatial dimension of the CMOS structures which are realized in this manner, typically on the order of 0.35 μm and less. The abbreviation CMOS means in this case Complementary Metal Oxide Semiconductor, i.e. semiconductor structures which are used in integrated circuits for the p-channel as well as for n-channel MOSFETs (Metal Oxide Semiconductor Field Effect Transistors), referred as PMOS and NMOS transistors.

A disadvantage in this case is the fact that with the CMOS processors that are realized with 0.35 μm PMOS transistors of the CMOS structures as mentioned above, the 1/f noise is increased when the structure is dimensioned in this manner in order to ensure the required bandwidth of the amplifier circuit. As a consequence, such an application in amplifier circuits according to the prior art results in a high noise level, for example, when applied to an amplifier circuit in the audio frequency field.

The task of the present invention is to provide an amplifier circuit arrangement realized as an integrated circuit with the CMOS technology, which is equipped with offset reduction and provided with a bandwidth that is sufficient for example for audio applications, and moreover, also has a low noise level that is sufficient for example for audio applications.

The task is achieved by an amplifier which has the characteristics according to claim 1.

Moreover, in accordance with the invention, another amplifier is integrated in the semiconductor body of an amplifier arrangement according to prior art for offset reduction, wherein the output of this additional amplifier is connected via a load to the input stage of the first amplifier of the two-stage amplifier circuit arrangement according to prior art, which impinges this additional amplifier at its output with a symmetrical load provided from current mirrors connected in parallel in a crosswise manner, whereby a three-stage amplifier circuit is created.

The advantageous effect of the invention results from the complementation of the two-stage, two amplifier circuit arrangement according to prior art by an additional, consequent arrangement, provided as a second amplifier, or referred to as a second amplifier stage arrangement, which corresponds to a separation of the first amplifier of the two-stage amplifier circuit according to prior art, respectively, into a first amplifier circuit arrangement (hereinafter referred to also as a first amplifier), and a second amplifier circuit, wherein both can thus be optimized in this manner independently of each other. The first amplifier stage is thus provided with two input stages connected in parallel, wherein one input stage is connected directly with the input terminals of the amplifier circuit, and the other input stage is connected at these input terminals through an amplifier.

Further advantages can be also obtained because when the second amplifier circuit arrangement or amplifier stage of the amplifier circuit is designed in this manner in order to achieve a low noise level of the amplifier circuit which is wholly sufficient for audio applications, the design of a first amplifier circuit arrangement or of the amplifier stage of the amplifier circuit is provided so as to realize a frequency response which can be compensated for to achieve a desired bandwidth of the amplifier circuit for audio applications.

Still other advantages can be obtained thanks to the fact that when the large input capacitance of the symmetric load formed by two current mirrors connected in parallel to each other in a crosswise manner, it provides a low-pass function such that only fine adjustment of the total frequency response is required in the first amplifier circuit arrangement of the amplifier circuit and thus also of the bandwidth.

Figure 2:
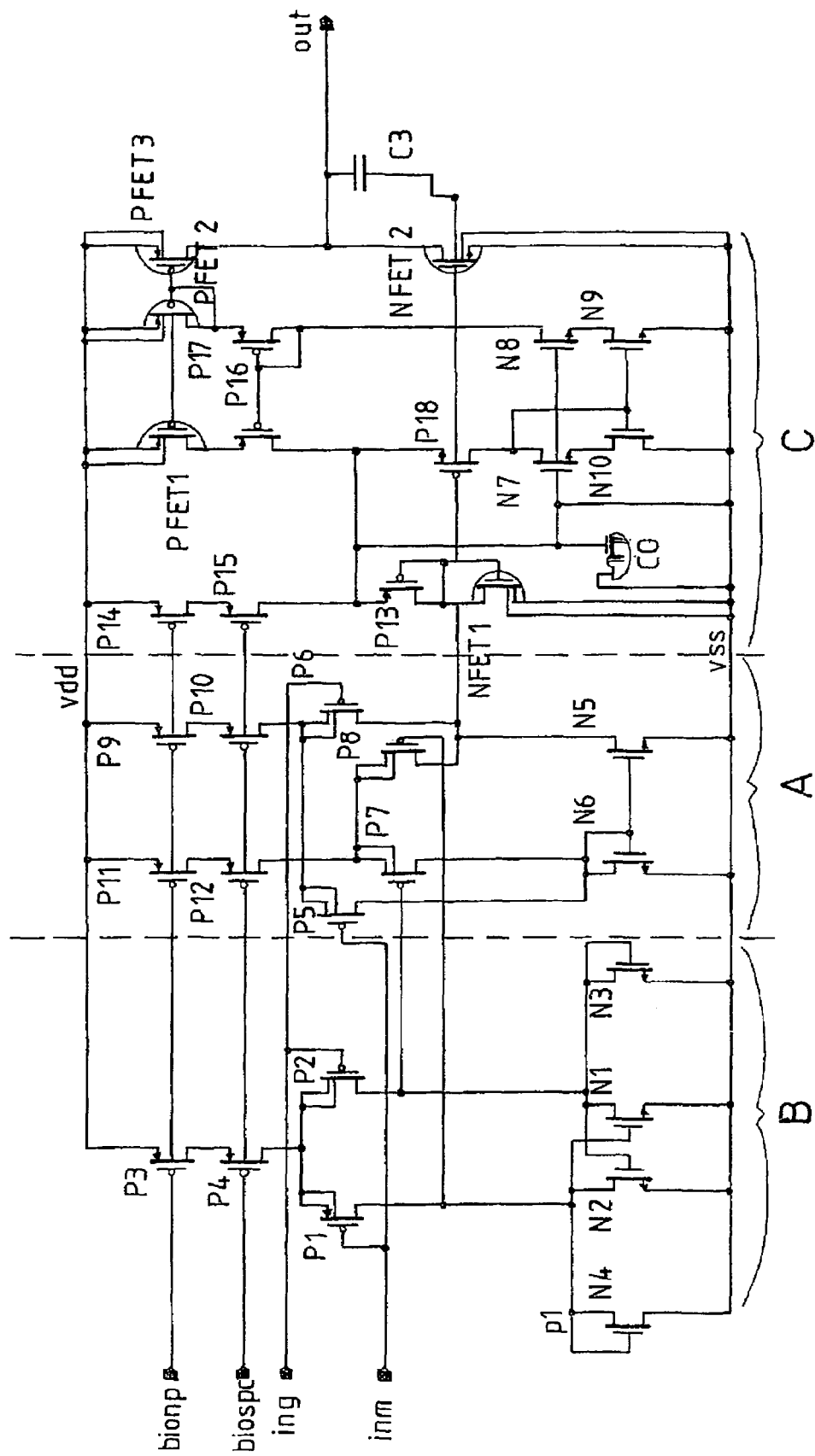

The invention is explained below in more detail based on an embodiment illustrated in the figures, wherein the same elements are provided with the same reference symbols. The illustrations show:

FIG. 1 a block diagram of the three-stage amplifier circuit,

FIG. 2 detailed view of the circuit arrangement of the three-stage amplifier circuit.

The circuit arrangement according to the invention is shown in FIG. 1 as a three-stage amplifier circuit comprising a first input terminal 1 and a second input terminal 2 of an amplifier A designed as a differential amplifier (differential difference amplifier), having a second amplifier B and a third amplifier C. The circuit arrangement shown in FIG. 1 further includes, connected in parallel, a first input stage 3, designed as a difference amplifier, and a second input stage 4, designed as a difference amplifier, forming the first amplifier A, as well as a first capacitor C1, a second capacitor C2, a third capacitor C3 and an output terminal 8.

As shown in FIG. 1, the first input terminal 1 is connected directly to the inverting input of the first input stage 3 of the first amplifier A, and the second input terminal 2 is connected directly to the non-inverting input of the first input stage 3 of the first amplifier A. In addition, the first input terminal 1 is directly connected to the inverting input of the second amplifier B, and the second input terminal 2 is connected directly to the non-inverting input of the second amplifier B. The outputs of the amplifier B, which is designed as a symmetrical difference amplifier, are connected to a symmetrical capacitive load, which is shown in more detail in FIG. 2 and which is indicated in FIG. 1 by the first capacitor C1 and the second capacitor C2.

Moreover, the plus output and the minus output of the second amplifier B, which is designed as difference amplifier, are completely symmetrically connected to the inverting and to the non-inverting input of the second difference amplifier, which is designed as a difference amplifier, at the input stage 4 of the first amplifier A. The output of the first amplifier A, which is formed by the parallel connection of the output of the first input stage 3 and the second input stage 4, is connected to the inverting input of the third amplifier C, wherein the third capacitor C3 is connected as a compensation capacitor with its terminal to the inverting input of the third amplifier C, and with its other terminal to the output of the third amplifier C and thus to the output terminal 8.

In this manner, the block diagram according to FIG. 1 illustrates the expansion of the two-stage amplifier circuit according to the prior art known from EP 0460 263 B1, wherein the third amplification stage C according to FIG. 1 is identical to the known realization of the second amplifier stage of the two-stage amplification circuit according to prior art. In contrast to the prior art, the first amplifier stage A is complemented by a second input stage 4, designed as a difference amplifier having for example a smaller steepness when compared to the first input stage 4, which is connected to the output to an additional, second amplifier stage B that is novel and different from prior art.

In this case, the CMOS structure of the second amplifier stage B is equipped with PMOS and NMOS transistor structures, which are designed in this manner with a 1/f noise level that is sufficiently low for audio application so that additional undesirable phase oscillations occur in frequency ranges which can have undesirable influences on the stability of the entire circuit. The embodiment form of the second amplifier stage B according to the present invention having the capacitors C1 and C2 is provided with low transit frequencies of about 1 MHz. The effective bandwidth of the second amplifier stage B must be therefore adjusted in such a manner so that these undesirable phase oscillation cannot exert any influence on the desired total frequency response.

This is achieved in accordance with the invention so that the second amplifier stage B is not operated with the load of a simple current mirror, but instead, it is operated with a symmetrical load comprising two current mirrors connected in parallel to each other in a crosswise manner, wherein the second amplifier stage B and the coupling of the second amplifier stage to the first amplifier stage A is preferably realized in a completely symmetrical manner.

Therefore, the high input capacity of the two current mirrors, which are connected to each other in parallel in a crosswise manner, will already cause desirable low-pass filtering of the output signal of the second amplifier stage B without additional devices. Fine adjustment of the desired frequency response is further achieved with the adjustment f the relative sizes of the steepness level of the respective first input stage 3 and of the second input stage 4, which are designed as a difference amplifier of the first amplifier stage A. FIG. 2 shows a detailed view of the circuit arrangement according to the invention in accordance with the description above.

The circuit arrangement according to the invention shown in FIG. 2 comprises a first p-channel MOS transistor structure P1 and a second p-channel MOS transistor P2, which together form the difference amplifier structure of the second amplifier stage B. Further, FIG. 2 also includes a third p-channel MOS transistor structure P3 and a fourth p-channel CMOS transistor structure P4, which form the current source for the structure of the difference amplifier with the first p-channel MOS transistor structure P1 and to the second p-channel MOS transistor structure P2. FIG. 2 further also includes a first N-channel MOS transistor structure N1, a second n-channel MOS transistor structure N2, a third n-channel MOS transistor structure N3 and a fourth n-channel MOS transistor structure N4, wherein the first n-channel MOS transistor channel structure N1 and the fourth n-channel MOS transistor structure N4 form a current mirror, and the second n-channel MOS transistor structure N2 and the third n-channel transistor structure N3 form a current mirror.

Further still, FIG. 2 also includes a fifth p-channel MOS transistor structure P5 and a sixth p-channel MOS transistor structure P6, which together form the difference amplifier structure of the first input stage 3 of the first amplifier A, as well as a seventh p-channel MOS transistor structure P7 and an eighth p-channel MOS transistor structure P8, which together form the difference amplifier structure of the second input stage 4 of the first amplifier A. FIG. 2 further also includes a ninth p-channel MOS transistor structure P9 and a tenth p-channel MOS transistor structure P10, which form the current source for the difference amplifier structure of the first input stage 3 of the first amplifier stage A for the fifth p-channel MOS transistor structure P5 and for the sixth p-channel MOS transistor structure P6.

Furthermore, FIG. 2 comprises an eleventh p-channel MOS transistor structure P11 and a twelfth p-channel MOS transistor structure P12, which form the current source for the difference structure of the second input stage 4 of the first amplifier A including the seventh p-channel MOS transistor structure P7 and the eight p-channel MOS transistor structure P8.

FIG. 2 further also includes a fifth n-channel MOS transistor structure N5 and a sixth n-channel MOS transistor structure N6, which form a current mirror that is used as a load for the first amplifier stage A.

FIG. 2 further also includes a thirteenth p-channel MOS transistor structure P13 and a first n-channel FET transistor structure NFET1, which form a component part of the third amplifier C. Further, FIG. 2 also includes a fourth p-channel MOS transistor structure P14 and a fifth p-channel MOS transistor structure R15, which form a current source for the chain of MOS diodes formed by the thirteenth p-channel MOS transistor structure P13 and the first n-channel PET transistor structure NFET1.

Further still, the circuit arrangement according to the invention shown in FIG. 2 comprises components known from prior art included in the third amplifier stage C. These components are a sixteenth p-channel CMOS transistor structure P16, a seventeenth p-channel CMOS transistor structure P17, an eighteenth p-channel CMOS transistor structure P18, as well as a seventh n-channel CMOS transistor structure N7, an eight n-channel CMOS transistor structure N8, a ninth n-channel CMOS transistor structure N9 and a tenth n-channel CMOS transistor structure N10.

FIG. 2 finally also includes the first p-channel FET transistor structure PFET1, the second p-channel PET transistor structure PFET2, the third p-channel FET transistor structure PFET3, the second n-channel FET transistor structure NFET2 and the capacitor C0 provided with a first and a second connection terminal, as well as with a first input terminal 1 corresponding to the input terminal inp according to FIG. 1, a second input terminal inm corresponding to the second terminal 2 according to FIG. 1, a third input terminal biasp and a fourth input terminal biaspc.

As shown in FIG. 2, the first input terminal inp is connected to the gate terminal of the second p-channel CMOS transistor structure P2 and to the gate terminal of the sixth p-channel CMOS transistor structure P6. Further, the second input terminal inm is connected to the gate terminal of the first p-channel CMOS transistor structure P1 and to the gate terminal of the fifth p-channel MOS transistor structure P5. The third input terminal biasp, receiving a suitable bias voltage, is connected to the gate terminal of the third p-channel MOS transistor structure P3, to the gate terminal of the eleventh p-channel CMOS transistor structure P1, to the gate terminal of the ninth p-channel CMOS transistor structure P9 and to the gate terminal of the fourteenth p-channel CMOS transistor structure P14. The fourth input terminal biaspc, impinged by a suitable bias voltage, is connected to the gate terminal of the fourth p-channel CMOS transistor structure P4, to the gate terminal of the twelfth p-channel CMOS transistor structure P12, to the gate terminal of the tenth p-channel CMOS transistor structure P10 and to the gate terminal of the fifteenth p-channel CMOS transistor structure P15.

Furthermore, as shown in FIG. 2, the source terminals of the third p-channel CMOS structure P3 are mutually connected to the eleventh p-channel CMOS transistor structure P11, the ninth p-channel CMOS transistor structure P9 of the fourteenth p-channel CMOS transistor structure P14, to the first p-channel FET transistor structure PFET1, to the second p-channel PET transistor structure PFET2, and to the third p-channel FET transistor structure PFET3, wherein this connection is provided with the potential for a high operating voltage vdd. Further still, the drain terminal of the p-channel CMOS transistor structure P3 is in this case connected to the source terminal of the fourth p-channel CMOS transistor structure P4, which is connected to the drain terminal of the eleventh p-channel CMOS transistor structure P11 with the source terminal of the twelfth p-channel of the CMOS transistor structure P12, the drain terminal of the ninth p-channel CMOS transistor structure P9 is connected to the source terminal of the tenth p-channel CMOS transistor structure P10, and the drain terminal of the fourteenth p-channel CMOS transistor P14 is connected to the source terminal of the fifteenth p-channel CMOS transistor structure P15, wherein each is equipped with respective current sources.

As shown in FIG. 2, such a current source is formed by the third p-channel CMOS transistor structure P3 and the fourth p-channel CMOS transistor structure P4, connected via the drain terminal of the fourth p-channel CMOS transistor structure P4 to the mutually connected source terminals of the first p-channel CMOS transistor structure P1 and a second p-channel CMOS transistor structure P2, which form the difference amplifier in the second amplifier stage B. Furthermore, a current source formed by the eleventh p-channel CMOS transistor structure P11 and by the twelfth p-channel CMOS transistor structure P12 is connected via the drain terminal of the twelfth p-channel CMOS transistor P12 to the mutually connected source terminals of the seventh p-channel CMOS transistor structure P7 and an eighth p-channel CMOS transistor structure P8, which form the difference amplifier of the second input stage 4 of the first amplifier stage A.

Further, as shown in FIG. 2, the current source formed by the ninth p-channel CMOS transistor structure P9 and the tenth p-channel CMOS transistor structure P10 is connected via the drain terminal of the tenth p-channel. CMOS transistor P10 to the mutually connected source terminals of the fifth p-channel CMOS transistor structure P5 and the sixth p-channel CMOS transistor structure P6 which form the difference amplifier of the first input stage 3 of the amplifier stage A.

Further still, the first output of the difference amplifier of the second amplifier stage B, which is formed by first p-channel CMOS transistor structure P1 and the second p-channel CMOS transistor structure P2, is formed by the drain terminal of the first p-channel CMOS transistor structure P1, connected to the drain terminal of the fourth-channel CMOS transistor structure N4, to the drain terminal of the second n-channel CMOS transistor structure N2, to the gate terminal of the fourth n-channel CMOS transistor structure N4 and to the gate terminal of the first n-channel CMOS transistor structure N1, wherein said connections are also mutually connected.

The second output of the difference amplifier in the second stage B, which is formed by first p-channel CMOS transistor structure P1 and the second p-channel CMOS transistor structure P2, is formed by the drain terminal of the second p-channel CMOS transistor structure P2, which in this case is connected to the drain terminal of the first n-channel CMOS transistor structure N1, to the drain terminal of the third n-channel CMOS transistor N3, to the gate terminal of the second n-channel CMOS transistor structure N2 and to the gate terminal of the third n-channel CMOS transistor structure N3, wherein said connections are also mutually connected.

Identical transistor structures are in this case preferably used for the construction of the first n-channel CMOS transistor structure N1, of the second n-channel CMOS transistor structure N2, of the third n-channel CMOS transistor structure N3 and of the fourth n-channel CMOS transistor structure N4. In this manner, the two current mirrors, formed from the two structures of the fourth n-channel CMOS transistor structure N4 and the second n-channel CMOS transistor structure N2, or from the first n-channel CMOS transistor structure N1 and the third n-channel CMOS transistor structure N3, represent identical current mirrors which form in accordance with the invention at the outputs of the differential amplifier of the amplifier stage B a symmetrical load from two current mirrors connected in a crosswise manner.

At the same time, the difference amplifier of the second amplifier stage B, which is formed by the first p-channel CMOS transistor structure P1 and the second p-channel CMOS transistor structure P2, has a first output formed of the drain terminal of the first p-channel CMOS transistor structure P1, which is further connected to the gate terminal of the eighth p-channel CMOS transistor structure P8, and has a second output formed by the drain terminal of the second p-channel CMOS transistor structure P2, which is further connected to the gate terminal of the seventh p-channel CMOS transistor structure P7, wherein the connections known from FIG. 1 are formed between the outputs of the second amplifier stage B and the inputs of the second input stage 4 of the first amplifier stage A.

Furthermore, as shown in FIG. 2, the drain terminal of the fifth p-channel CMOS transistor structure P5 is connected to the drain terminal of the sixth n-channel CMOS transistor structure N6, to the drain terminal of the seventh p-channel CMOS transistor structure P7, to the gate terminal of the sixth n-channel CMOS transistor N6 and the gate terminal of the fifth n-channel CMOS transistor structure N5, wherein said connections are also mutually connected to each other. Further still, the drain terminal, of the eighth p-channel CMOS transistor structure P8 is connected to the drain terminal of the sixth p-channel CMOS transistor structure P6, to the drain terminal of the fifth n-channel CMOS transistor structure N5, to the gate terminal of the eighteenth p-channel CMOS transistor structure P18 and to the gate terminal of the second n-channel FET transistor structure NFET2, wherein said connections are also mutually connected to each other.

Further, the parallel connection, also shown in FIG. 1, of the first input stage 3 of the amplifier A and the second input, stage 4 is shown by these connections:

Further, these connections result in the parallel circuit of the first input stage 3 and the second input stage 4 of the first amplifier stage A, which is known from FIG. 1, wherein the first input stage 3 is formed by fifth p-channel. CMOS transistor structure P5 and sixth p-channel CMOS transistor structure P6 and the second input stage 4 is formed by seventh p-channel CMOS transistor structure P7 and eighth p-channel CMOS transistor structure P8.

In accordance with the invention, the second input stage 4 is provided in this case with a steepness corresponding to a fraction of the steepness of the first input stage 3, preferably one quarter of this steepness. The current mirror formed by the sixth n-channel CMOS transistor structure N6 and by the fifth n-channel CMOS transistor structure N5 in this case represents the load for the first amplifier stage A.

The functioning of the third amplifier stage C, whose circuit is described with the remaining structural components in detail in FIG. 2, comprised herein and described below, corresponds to the functioning of the second amplifier stage known form the EP 0460 263 B1.

As shown in FIG. 2, the current source, which is formed by the fourteenth p-channel CMOS transistor structure P14 and by the fifteenth p-channel CMOS transistor structure P15, is connected via the drain terminal of the fifteenth p-channel CMOS transistor structure P15 to the mutually interconnected source terminals of the thirteenth p-channel CMOS transistor structure P13 and to the eighteenth p-channel CMOS transistor structure P18, as well as to the gate terminal of the eight n-channel MOS transistor structure N8, to the gate terminal of the seventh n-channel CMOS transistor structure N7, to the first connection terminal of the capacitor C0, and to the drain terminal of the sixteenth p-channel CMOS transistor structure P16, so that all listed connections and terminals, which are connected to the current sources formed by the fourteenth p-channel CMOS transistor structure P14 and by the fifteenth p-channel transistor structure P15, are in this manner mutually connected to each other.

Further, as shown in FIG. 2, the drain terminal of the eighteenth p-channel CMOS transistor structure P18 is connected to the drain terminal of the seventeenth n-channel CMOS transistor structure N7, as well as with the gate terminal of the tenth n-channel CMOS transistor structure N10 and to the gate terminal of the ninth n-channel CMOS transistor structure N9, so that the gate terminals of the tenth n-channel CMOS transistor structure N10 and of the ninth n-channel CMOS transistor structure N9 are also mutually connected to each other. In the same manner, as shown in FIG. 2, the source terminal of the seventh n-channel of the CMOS transistor structure N7 is connected to the drain terminal of the tenth n-channel CMOS transistor structure N10, and the source terminal of the eight n-channel CMOS transistor structure N8 is connected to the drain terminal of the ninth n-channel CMOS transistor structure N9.

In the same manner, as shown in FIG. 2, the gate terminals of the sixteenth p-channel CMOS transistor structure P16 are connected to the seventeenth p-channel CMOS transistor structure P17, the gate terminals of the sixteenth p-channel CMOS transistor structure P16 and of the seventh p-channel CMOS transistor structure P17 are connected are connected to the drain terminal of the seventeenth p-channel CMOS transistor structure P17 and to the drain terminal of the eighth n-channel CMOS transistor structure N8.

Further, as shown in FIG. 2, the source terminal of the sixteenth p-channel CMOS transistor structure P16 is connected to the drain terminal of the first p-channel FET transistor structure PFET1, the gate terminal of the of the first p-channel FET transistor structure PFET1 is connected to the gate terminals of the second p-channel FET transistor structure PFET2 and the third p-channel of the FET transistor structure PFET3. In the same manner, the gate terminal of the second p-channel FET transistor structure PFET2 is connected to the drain terminal of the second p-channel FET transistor structure PFET2 and to the source terminal of the seventeenth p-channel CMOS transistor structure P17, the drain terminal of the third p-channel FET transistor structure PFET 3 is connected to the drain terminal of the second n-channel FET transistor NFET2 and to the output terminal out.

Similarly, as shown in FIG. 2, mutually connected to each other are also the source terminals of the first n-channel CMOS transistor structure N1, which are connected to the second n-channel CMOS transistors structure M1, to the third n-channel CMOS transistor structure N3, to the fourth n-channel CMOS transistor structure N4, to the sixth n-channel CMOS transistor structure N6, to the fifth n-channel CMOS transistor structure N5, to the first n-channel FET transistor structure NFET1, to the second n-channel FET transistor structure NFET2, as well as the second connection terminal of the capacitor C0, while this connection provides the potential for the low operation voltage vss, or for ground connection.

The arrangement indicated by areas B, A and C in the amplifier circuit according to FIG. 2 explains the allocation of the described structural elements to the amplifier stages known from the circuit diagram according to FIG. 1 in the second amplifier stage B, in the first amplifier stage A and in the third amplifier stage C. It should be noted that the expansion of a two-stage amplifier circuit arrangement to a three-stage amplifier circuit arrangement can be realized with any type of two-stage amplifier circuit arrangement in the manner described.

LIST OF REFERENCE SYMBOLS

A amplifier
B amplifier
C amplifier
1 input terminal
2 input terminal
3 input terminal
4 input terminal
8 output terminal
out output terminal
pod input terminal
binsp input terminal
binspc input terminal
inm input terminal
inm input terminal
inp input terminal
N1 n-channel CMOS transistor structure
N2 n-channel CMOS transistor structure
N3 n-channel CMOS transistor structure
N4 n-channel CMOS transistor structure
N5 n-channel CMOS transistor structure
N6 n-channel CMOS transistor structure
N7 n-channel CMOS transistor structure
N8 n-channel CMOS transistor structure
N9 n-channel CMOS transistor structure
N10 n-channel CMOS transistor structure
P1 p-channel CMOS transistor structure
P2 p-channel CMOS transistor structure
P3 p-channel CMOS transistor structure
P4 p-channel CMOS transistor structure
P5 p-channel CMOS transistor structure
P6 p-channel CMOS transistor structure
P7 p-channel CMOS transistor structure
P8 p-channel CMOS transistor structure
P9 p-channel CMOS transistor structure
P10 p-channel CMOS transistor structure P11 p-channel CMOS transistor structure
P12 p-channel CMOS transistor structure
P13 p-channel CMOS transistor structure
P14 p-channel CMOS transistor structure
P15 p-channel CMOS transistor structure
P16 p-channel CMOS transistor structure
P17 p-channel CMOS transistor structure
P18 p-channel CMOS transistor structure
NFET1 n-channel FET transistor structure
NFET2 n-channel FET transistor structure
PFET1 p-channel FET transistor structure
PFET2 p-channel FET transistor structure
PFET3 p-channel FET transistor structure
vdd voltage potential
vss voltage potential
C0 capacitor
C1 capacitor
C2 capacitor
C3 capacitor

The invention claimed is:

1. An amplifier having offset reduction and a bandwidth, comprising:
 a first amplifier having first and second input stages connected in parallel at input terminals, wherein the first input stage is connected directly to the input terminals and the second input stage is connected through a second amplifier, and
 a third amplifier connected at the output of the first amplifier, wherein the second amplifier is provided with a symmetrical load.

2. The amplifier circuit according to claim 1, wherein the symmetrical load is coupled in a crosswise manner.

3. The amplifier circuit according to claim 1, wherein the symmetrical load comprises two current mirrors connected in parallel in a crosswise manner.

4. The amplifier according to claim 1, wherein the output of the second amplifier is connected completely symmetrically to the input of the second input stage of the first amplifier.

5. The amplifier according to claim 1, wherein the symmetrical load is formed from n times four identical transistors, wherein n is a natural number.

6. The amplifier according to claim 1, wherein the amplifier circuit is configured for audio applications.

7. The amplifier according to claim 1, wherein the second input stage is configured to have a steepness that corresponds to a fraction of a steepness of the first input stage.

8. The amplifier according to claim 7, wherein the fraction is approximately ¼.

* * * * *

UNITED STATES PATENT AND TRADEMARK OFFICE
CERTIFICATE OF CORRECTION

PATENT NO. : 7,521,994 B2 Page 1 of 1
APPLICATION NO. : 11/903191
DATED : April 21, 2009
INVENTOR(S) : Theus et al.

It is certified that error appears in the above-identified patent and that said Letters Patent is hereby corrected as shown below:

On the Title page, item

(73) Assignee: replace "Freigurg (DE)" with --Freiburg (DE)--

Signed and Sealed this

Nineteenth Day of January, 2010

David J. Kappos
*Director of the United States Patent and Trademark Office*